(12) United States Patent
Moinpour et al.

(10) Patent No.: US 6,334,229 B1
(45) Date of Patent: Jan. 1, 2002

(54) APPARATUS FOR CLEANING EDGES OF CONTAMINATED SUBSTRATES

(75) Inventors: Mansour Moinpour, Cupertino; Hoang T. Nguyen, San Jose; Mohsen Salek, Cupertino; Young C. Park, Mountain View, all of CA (US); Tom Bramblett, Hillsboro, OR (US); John M. deLarios, Palo Alto, CA (US); Lynn S. Ryle, San Jose, CA (US); Donald E. Anderson, Morgan Hill, CA (US); Wilbur C. Krusell, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/227,272

(22) Filed: Jan. 7, 1999

Related U.S. Application Data

(62) Division of application No. 08/640,459, filed on May 1, 1996, now Pat. No. 5,861,066.

(51) Int. Cl.[7] .......................... B01B 11/02; A46B 13/04
(52) U.S. Cl. .............................. 15/77; 15/88.3; 15/102; 451/44; 451/245
(58) Field of Search .......................... 15/77, 88.2, 88.3, 15/97.1, 102; 451/43, 44, 254, 255, 256

(56) References Cited

U.S. PATENT DOCUMENTS

| 4,217,733 | A | * | 8/1980 | Van Sickle | 15/88.3 |
|---|---|---|---|---|---|
| 5,067,193 | A | * | 11/1991 | Thomas | 15/88.3 |
| 5,161,281 | A | * | 11/1992 | Hanen | 15/88.3 |
| 5,351,360 | A | * | 10/1994 | Suzuki et al. | 15/88.3 |
| 5,476,413 | A | * | 12/1995 | Hasegawa et al. | 451/44 |
| 5,478,405 | A | * | 12/1995 | Miura et al. | 134/9 |
| 5,624,501 | A | * | 4/1997 | Gill, Jr. | 134/6 |
| 5,908,509 | A | * | 6/1999 | Olesen et al. | 134/1.3 |

* cited by examiner

Primary Examiner—Robert J. Warden, Sr.
Assistant Examiner—Kaj Olsen
(74) Attorney, Agent, or Firm—Martine & Penilla, LLP

(57) ABSTRACT

An apparatus for cleaning edges of substrates is described. The present invention provides a cleaning mechanism that cleans particles off the edge of the wafer based on friction and/or a difference in tangential velocity at a point of contact between the wafer and the cleaning mechanism.

31 Claims, 5 Drawing Sheets

APPARATUS FOR CLEANING EDGES OF CONTAMINATED SUBSTRATES

This application is a division of application Ser. No. 08/640,459, filed May 1, 1996, now U.S. Pat. No. 5,861,066.

FIELD OF INVENTION

The present invention relates to the field of semiconductor wafer processing; more particularly, the present invention relates to cleaning semiconductor substrates (wafers).

DESCRIPTION OF RELATED ART

Semiconductor manufacturers use semiconductor wafers as the base for manufacturing integrated circuits. In one step of the manufacturing process, the wafers are put through chemical mechanical polishing (CMP). CMP is becoming the main planarization technology for both dielectric and metal layers. For the CMP of dielectric layers, such as BPSG, BPTEOS, and PECVD Oxides (often referred to as the ILD0, ILD1, ILD2 . . . layers, respectively), a fumed silica-based slurry is normally used. Other slurries, such as dispersed silica, fumed or dispersed allumina, are also being used for CMP of both oxides and metals (such as tungsten (W) and titanium (Ti)). When the CMP process is completed, the wafers' surfaces are covered in particles, referred to as a slurry residue. At later steps in the process flow, some of this slurry residue is redistributed across the front of the wafer, thereby resulting in a loss in die yield and/or device performance. To prevent the slurry redistribution, all surfaces of a wafer must be free of contamination.

Different post CMP cleaning methods have been introduced in the last few years. These include cleaning the wafers in wet stations using conventional wet cleaning methods, such as SC1, HF and megasonic cleaning. Other cleaning methods in use are based on scrubbing wafers with brushes of various kinds and configurations using DI water or a combination of DI with chemicals such as Ammonia and Citric acid.

One system used to remove wafer contaminants is a double sided scrubber. In a double sided scrubber, a semiconductor wafer is scrubbed simultaneously on both sides by brushes. Since the wafer is being scrubbed simultaneously on both sides by the brushes, there must be a way of holding the wafer in place and rotating the wafer so the entire surface of the wafer is cleaned. A mechanism used for this purpose is commonly referred to as a roller.

Today, double sided scrubbers are usually automated and comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. FIG. 1 illustrates a conventional double sided wafer scrubber. Referring to FIG. 1, a wafer 101 is being scrubbed by brushes, one of which is shown as brush 102 and the other being beneath wafer 101 and directly below brush 102. Rollers 103 rotate wafer 101 so the entire wafer surface may be cleaned. Each of brushes 102 is rotated about its central axis by a motor 104. The rotary motion of rollers 103 is then transferred to wafer 101 when the edge of each of rollers 103 comes into contact with the outer edge of wafer 101.

Brush cleaning systems can effectively clean the front and backs of semiconductor substrates. However, brushes do not provide a sufficient amount of mechanical energy at the edge/bevel to remove contamination. In other words, although the double sided scrubbers are extremely effective at cleaning the front and back side of a wafer, they can leave a slurry residue on the bevel. Likewise, all of the above methods fail to clean the very edge and bevel area of the substrate (wafer) as well. In other words, all current scrubbing methods and apparatus are unable to clean the very edge and bevel area of the substrate (wafer).

The present invention provides a method and apparatus that cleans the edge of substrates, including the bevel area when present.

SUMMARY OF THE INVENTION

A method and apparatus for cleaning edges of substrates is described. The present invention provides a cleaning mechanism that cleans particles off the edge of the wafer based on friction and/or a difference in tangential velocity at a point of contact between the wafer and the cleaning mechanism.

BRIEF DESCRIPTION OF DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE INVENTION

A method and apparatus for cleaning edges of contaminated substrates is described. The cleaning process may be used in double sided scrubber systems or other systems, such as, for instance, chemical mechanical polishing systems or flat panel display manufacturing systems. In the following description, numerous specific details are set forth such as rotation speeds, chemicals, pressures, etc., in order to provide a thorough understanding of the present invention. It will be apparent, however, to one skilled in the art that the present invention may be practiced without these specific details. In other instances, well-known components, structures and techniques have not been shown in detail in order to avoid obscuring the present invention.

Overview of the Present Invention

The present invention provides a method and apparatus that cleans the edge of substrates, including the bevel area when present. In the present invention, particles are removed from the edge and/or bevel area (or any other surface sloping from the edge to the top or bottom of the substrate) using a side scrubbing mechanism incorporated into a scrubber tool.

In one embodiment of the present invention, the side scrubbing mechanism comprises a brush added to a double-sided scrubber, which is described below.

Although the present invention is described in conjunction with the scrubbing of a wafer, it will be appreciated that any similarly shaped, i.e. generally flat, substrate, may be processed by the methods and apparatuses of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, two or multiple substrates bonded to each other, or substrates for processing other apparatuses and devices such as flat panel displays, multichip modules, etc.

Figure 1:
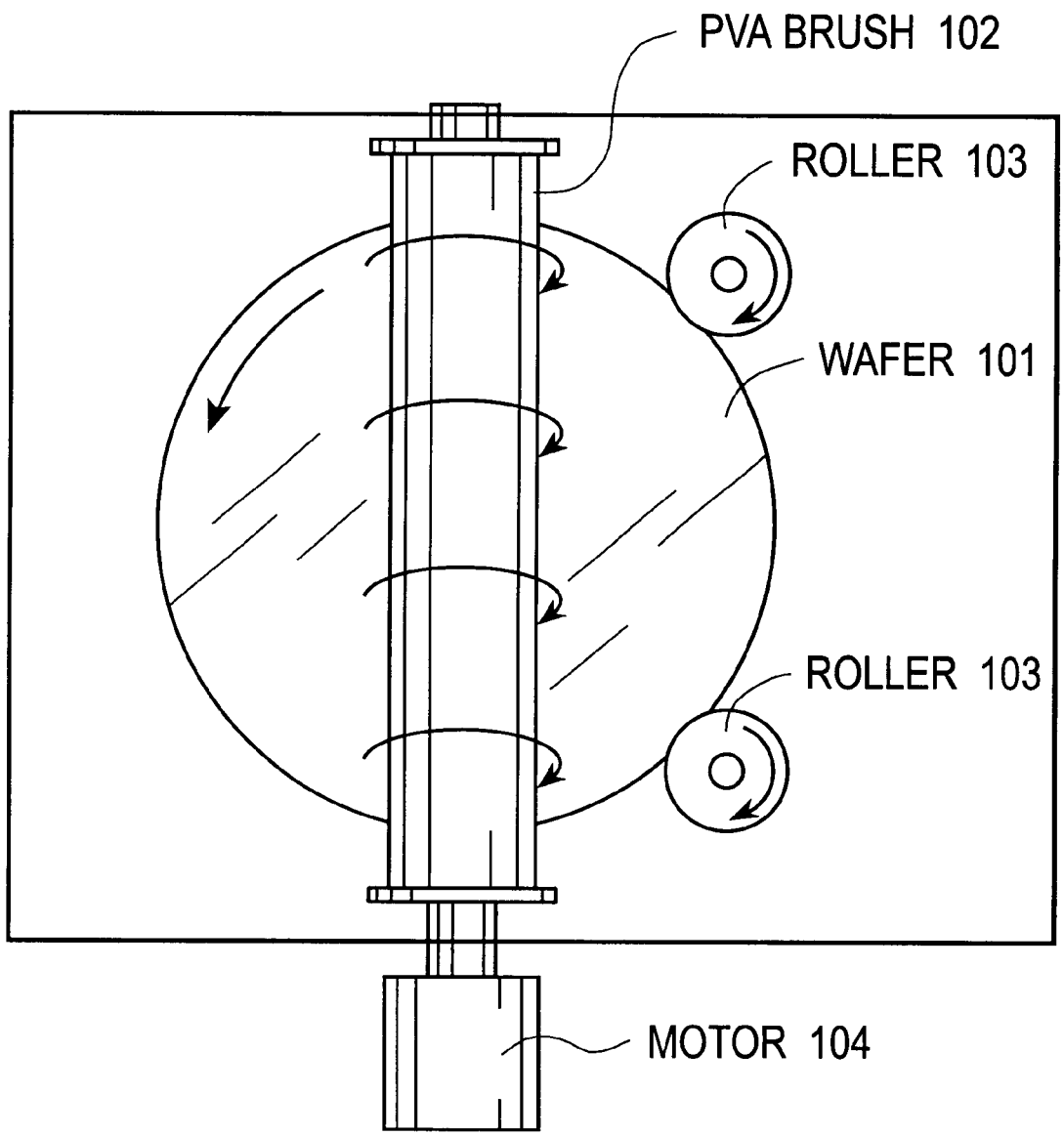
FIG. 1 illustrates a conventional double sided wafer scrubber.
Figure 2A:
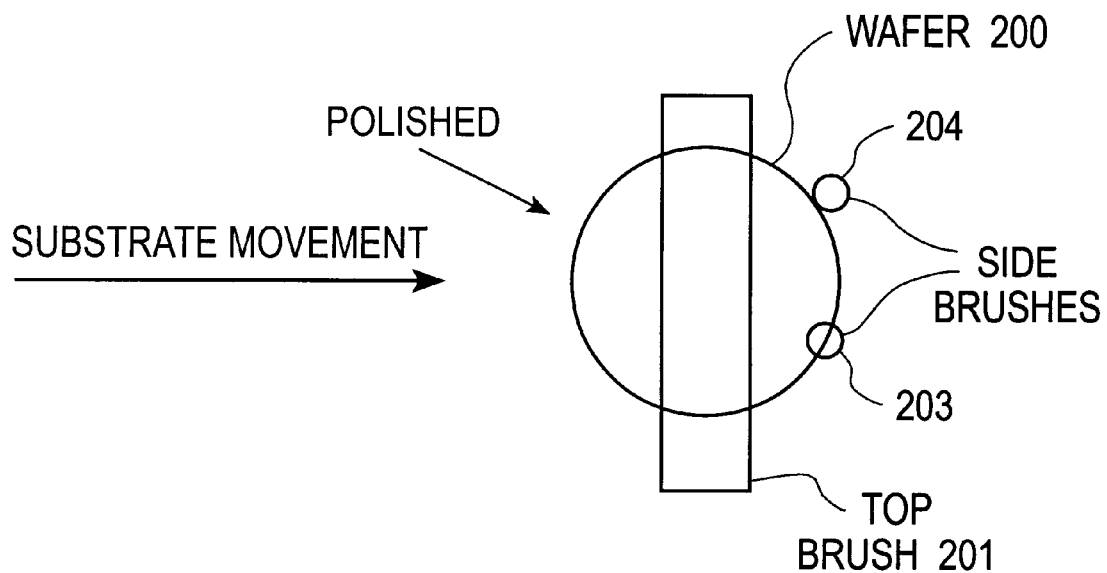
FIG. 2A illustrates the top view of the side brush mechanism of the present invention.
Figure 2B:
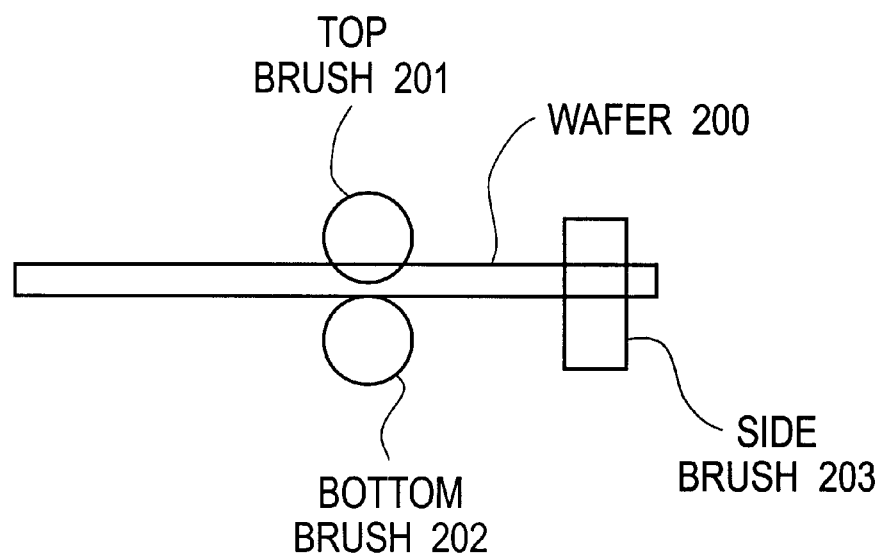
FIG. 2B illustrates a side view of the side brush mechanism of the present invention.

FIGS. 2A and 2B illustrate a simplified top view and a simplified side view of the side scrubbing mechanism of the present invention, respectively. The side scrubber may be added to a double-sided scrubber. Note that FIGS. 2A and 2B illustrate only an exemplary configuration and other configurations are possible.

Referring to FIGS. 2A and 2B, a wafer 200 is shown being cleaned by top-side brush 201 as it moves through the scrubber (from left to right as depicted). Along either or both of two side locations, 203 and 204, are side brush scrubbing mechanisms. Referring to FIG. 2B, top-side brush 201 is again shown with wafer 200. Bottom-side brush 202 is shown below wafer 200, along with a single side brush 203. In one embodiment, the side brush is made of Poly Vinyl Alcohol (PVA), nylon, polyurethane, or other abrasive materials. As wafer 200 moves through the scrubber system, brushes 201 and 202 clean the top and bottom (e.g., the front and back) of wafer 200, while side brush(es) 203 removes particles along the edge and bevel areas of wafer 200 (due to, e.g., friction, tangential velocity difference, etc.).

One benefit of the present invention is that through the combination of the side scrubbing mechanism and the top and bottom brushes all of the exposed areas of the wafer which may be contaminated with slurry particles are cleaned. This includes the top surface, bottom surface and the edge/bevel area.

The side scrubbing mechanism of the present invention may be shaped in a variety of shapes. For instance, in one embodiment, the side scrubbing mechanism may be shaped like a roller, while in an alternative embodiment, the side scrubbing mechanism may be shaped like a "dog bone." Furthermore, the side scrubbing mechanism may be flat or with nibs (like that typically found on the top and bottom brushes).

Figure 3:
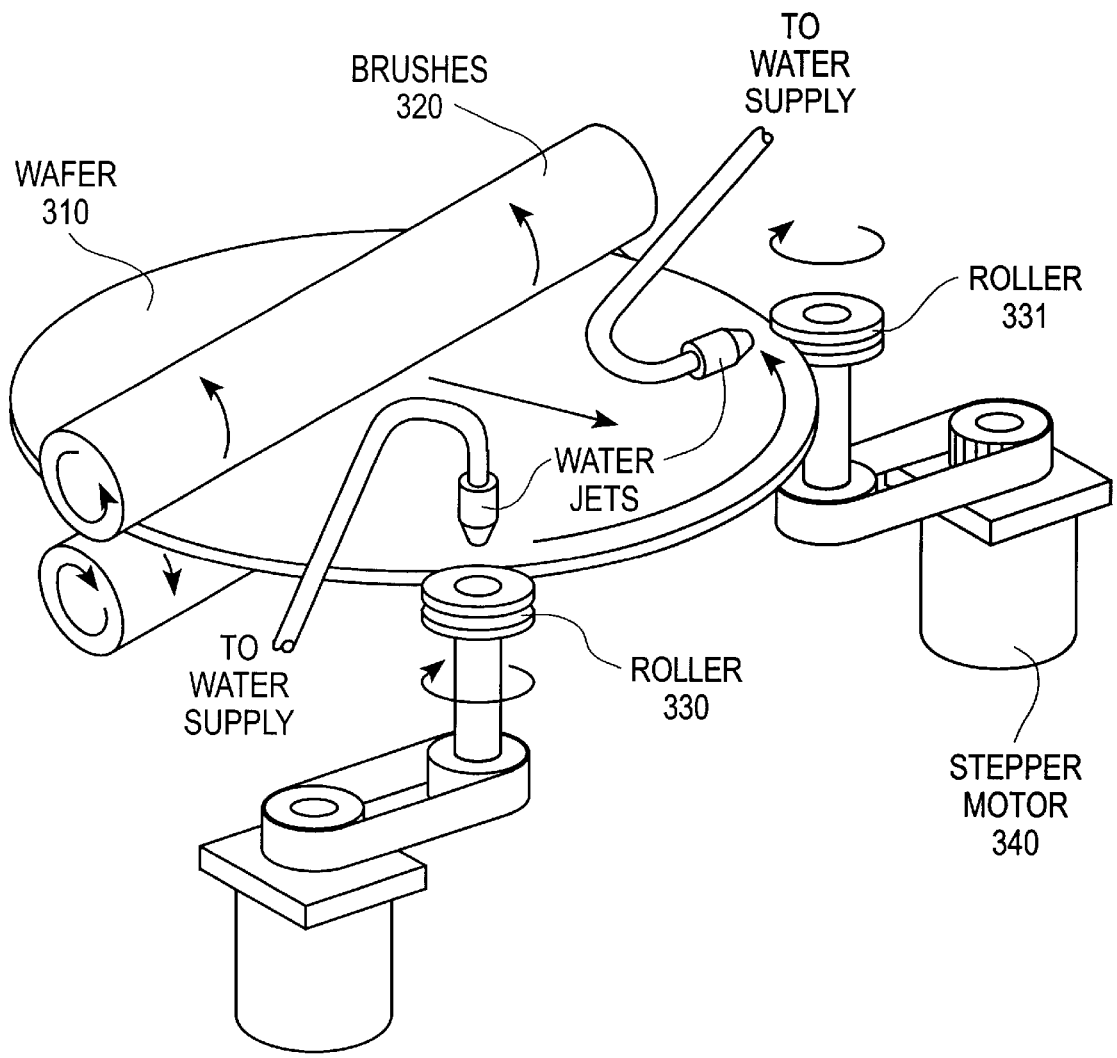
FIG. 3 illustrates one embodiment of the side brush mechanism of the present invention incorporated into one of the rollers.

FIG. 3 illustrates one embodiment of the side brush of the present invention incorporated into a roller. Referring to FIG. 3, wafer 310 is placed between brushes 320 of the double sided scrubber. Motor 340 rotates roller 330 of the present invention. When roller 330 is in contact with wafer 310 friction is created between their edges. Thus, the rotating motion of rollers 330 and 331 and the friction that is created causes wafer 310 to rotate. The rotation of wafer 310 between brushes 320 allows the entire surface of the wafer to be cleaned. The two rollers 330 and 331 contact the wafer at two locations to rotate the wafer and to hold it in place (i.e., prevent forward motion) as it is scrubbed. The edge/bevel area is cleaned due to a difference in tangential velocity at the point of contact between the substrate and the side scrubbing mechanism.

In one embodiment, roller 330 rotates at 40 revolutions per minute (rpm), while roller 331 rotates at 60 rpm. In this manner, the ratio of rotational speeds between rollers 330 and 331 is 1.5, or a ratio that is approximate thereto. In alternate embodiments, the rotational speed of roller 330 may be 10–15% less than the rotational speed of roller 331. Note that any difference between rotation speeds of the wafer and the roller may be used to clean the edge/bevel areas.

Figure 4:
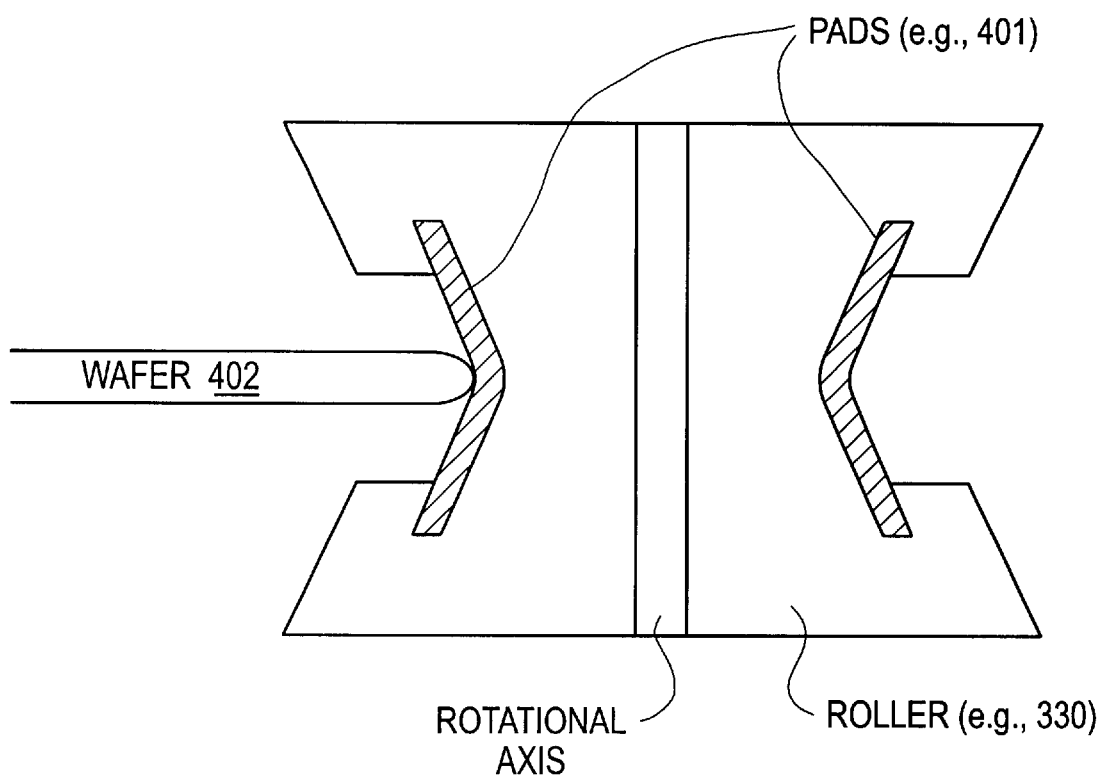
FIG. 4 illustrates a side section view of a pad and roller combination used for scrubbing the edge of a substrate.

To enhance particle removal, roller 330 includes a pad made of an abrasive (e.g., nylon, PVA, polyurethane, etc.). FIG. 4 illustrates one embodiment of roller 330 with pad 401. An exemplary wafer 402 is also shown. In one embodiment, pad 401 comprises a SubaIV pad manufactured by Rodel of Newark, Del. Other abrasive pads such as IC1000, suba500, politex (all manufactured by Rodel) can also be used.

Note that the pad can be of different thickness and surface texture to increase and/or even maximize the cleaning action. The pad may also be shaped to remove particles only from an edge, where for instance, the wafer is without bevel areas that cannot be cleaned by the top and bottom brushes.

To further facilitate particle removal, water jets may be used to propel water into or near the point of contact between rollers 330 and 331 and the wafer, such as shown in FIG. 3. Such water jets may be positioned such that the direction of water flows from a plane aligned with the rotational axis of the wafer and contact points between the wafer and the side scrubbing mechanism. In such a case, the water may simply carry the particles away that are removed from the wafer by the side scrubbing mechanism or may, if at sufficient pressure, cause removal of particles by itself. The water jet can also act as pad conditioning when it is directed toward the side scrubbing mechanism. Although two jets are shown, only one jet may be used to help facilitate particle removal. Note that the water jets are held in place by support structures which are well-known in the art. In one embodiment, the water jets are held in place above the wafer. Such a jet may be as simple as a barbed coupling with reducing barb to increase the velocity of the created stream. In one embodiment, the barbed coupling is 1/8" to 1/16" in diameter. In another embodiment, the jet may include a nozzle that produces a fanned, knife edge pattern. Water jets are well-known in the art. Note also that jets that spray other chemicals may be used, instead of water, to facilitate particle removal.

The pad may be cleaned occasionally to remove build-up of particles. The side scrubbing mechanism of the present invention may be self-cleaning. In one embodiment, the side scrubbing mechanism may flow DI water or a combination of DI water and a chemical such as $NH_4OH$ or $NH_4OH/H_2O_2$ mixture through itself. In an alternate embodiment, the side scrubbing mechanism may be self-cleaning by spraying DI or a combination of DI and a chemical such as $NH_4OH$ or $NH_4OH/H_2O_2$ onto it during substrate cleaning to reduce build-up. In cases where water is used, manual or self-cleaning is generally not required, but may be used.

The present invention may be used for post CMP of both oxide and metal, including, but not limited to, layers of W, Ti, Al, or Cu. However, the present invention is not limited to use in CMP applications. Also, the present invention may be extended to accommodate all substrate sizes in the future.

Furthermore, the present invention is easily integrated into existing post-CMP scrubber technologies. That is, wafers (e.g., dielectric, metal) may undergo CMP using, for instance, a slurry (e.g., fumed silica-based, dispursed silica, fumed or dispersed alumina, etc.). Such CMP is well-known to those skilled in the art. As a result of the CMP process, the surface of the wafers is covered with particles (e.g., slurry residue).

After the CMP process, the wafers are cleaned. In one embodiment, the wafers are cleaned using a scrubber, which scrubs the top and bottom sides of the wafer using a single-sided scrubber or a double-sided scrubber.

The edge (and bevel areas) of the wafer are also cleaned in accordance with the present invention. In one embodiment, the top and bottom (the two sides) of the wafers are cleaned simultaneously with the edge (and bevel areas) of the wafer.

An Exemplary Scrubber

Figure 5:
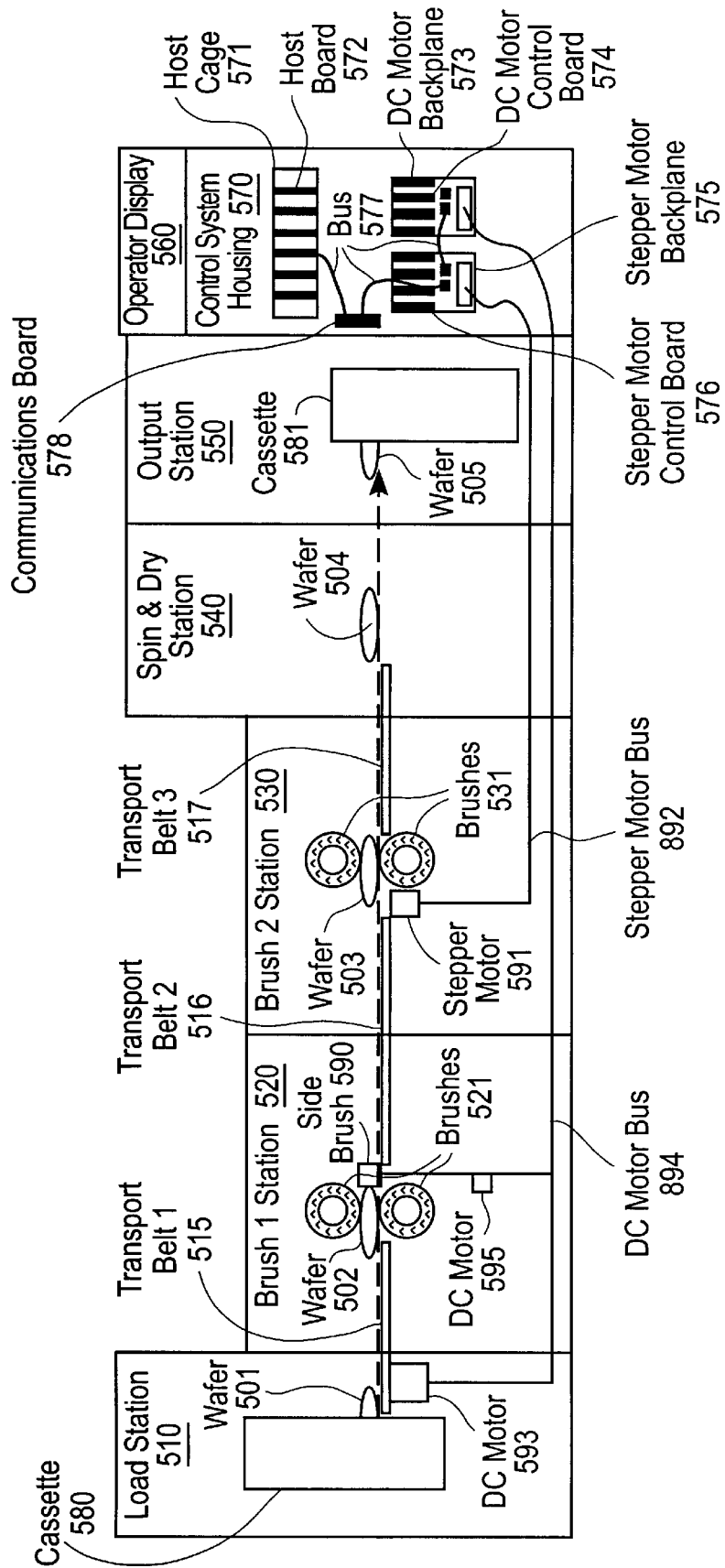
FIG. 5 illustrates one embodiment of the double-sided scrubber system of the present invention.

FIG. 5 illustrates a conceptual view of a double sided wafer scrubber (scrubber) as may be used by one embodiment of the present invention. The scrubber includes a number of stations. Each of theses stations logically represent one or more steps in the wafer cleaning process. These stations can also include the hardware and software that completes one of the steps in the cleaning process. The cleaning process includes the steps executed by the scrubber on the wafers. In one embodiment, the scrubber can process multiple wafers simultaneously; one or more wafers are being processed in each of the stations at a point in time.

Dirty wafers are loaded at one end of the scrubber; clean wafers are unloaded from the other end of the scrubber.

In load station 510 (also known as the input station), the operator loads a cassette 580 into the scrubber. The cassette 580 contains a number of dirty wafers. Wafers are automatically moved from load station 510 to brush 1 station 520 on transport belt 1 515. Transport belt 1 515 is moved by DC motor 593. Wafer 501 represents a dirty wafer being automatically removed from cassette 580 and placed on transport belt 1 515.

In brush 1 station 520, a dirty wafer 502, is brushed and sprayed (water jets not shown), to remove some of the particles from the dirty wafer 502. Brushes 521 scrub both sides of the dirty wafer 502. The height of the top brush is controlled by a stepper motor (not shown). Side brush 590 scrubs the edge and bevel areas of dirty wafer 502. The once brushed wafers are then automatically moved to brush 2 station 530. This is done by transport belt 2 516, controlled by a second DC motor (not shown).

In brush 2 station 530, a once brushed wafer 503 is brushed and sprayed (water jets not shown), to remove more of the particles from the once brushed wafer 503. Brushes 531 scrub both sides of the once brushed wafer 503. The height of the top brush of brushes 531 are controlled by stepper motor 591. Although not shown, brush 2 station 530 may also include a side brush, like side brush 590, to clean the edge and bevel area of once brushed wafer 503. The twice brushed wafers are then automatically moved to spin & dry station 540, via transport belt 3 517.

Spin & dry station 540 rinses the wafers, spins them, and dries them. Wafer 504 represents a wafer being processed in the spin & dry station 540. At this point, the wafer has been cleaned. Note, for one particular type of wafer, the wafer must have been kept wet during the load station 510, brush 1 station 520, and brush 2 station 530. Only after being brushed and rinsed can this type of wafer then be spun and dried. The spun and dried wafer is then moved to the output station 550.

In output station 550, the clean wafer is put into a cassette 581. Wafer 505 represents a clean wafer being put into cassette 581. The cassette 581, when full of clean wafers, can then be removed by the operator. This completes the cleaning process.

Control system housing 570 houses a number of components that comprise the heart of the control system for the scrubber. Control system housing 570 includes a host cage 571 having a host board 572. The host board 572 provides the overall control for the scrubber. The host board 572 typically includes one or more host processors implemented in one or more physical packages. The host board 572 can include a board from Gespac, Inc., of Scottsdale, Ariz. (a Motorola 68030 based processor board, part number MPU-3OH8). The host cage 571 provides support for the host board 572 and other boards in the host cage (e.g. sensor input boards, a video card for operator display 560, a board for communicating signals from the host board 572 to the rest of the control system).

The host board can communicate to the rest of the control boards through another board in the host cage 571, (communication board 578) or through a connector directly to the host board 572. A control board is typically a modular circuit formed on a printed circuit board, that controls motors or other devices within a scrubber. Typically, the communications from the host cage pass through a communications board 578. The communications board, in turn, communicates with other devices through a bus 577.

Bus 577 supports an easily extensible and modular control system. In the scrubber of FIG. 5, the bus 577 links the host board 572, the communications board 578, the stepper motor backplane 575 and the DC motor backplane 573. Messages between the various devices attached to the bus 577 can be communicated according to a protocol described below. A message is a packet of information to be communicated from one point to another point.

The stepper motor backplane 575 supports a stepper motor control board 576. This stepper motor control board 576 controls the movement of stepper motor 591 via stepper motor bus 592. Similarly, the DC motor backplane 573 supports a DC motor control board 574. The DC motor control board 574 controls the movement of the DC motor 593 and DC motor 595 via DC motor bus 594.

In one embodiment of the present invention, each of these backplanes support up to four motor control boards. However, one of ordinary skill in the art would understand that the present invention is not limited to backplanes that support only four motor control boards.

Operator display 560 typically includes a monitor like a cathode ray tube, or flat panel display. In one embodiment, operator display 560 also includes a touch sensitive screen allowing the operator to interact with the scrubber control system.

Note that FIG. 5 is a conceptual drawing. Some components are represented by one symbol so as to not overly obscure the present invention. For example, it is possible to have transport belt 3 517 be made of two or more physical transport belts, each belt being moved by a different DC motor.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims which in themselves recite only those features regarded as essential to the invention.

Thus, a method and apparatus for cleaning edges of substrates has been disclosed.

What is claimed is:

1. A scrubber for scrubbing a semiconductor wafer having an edge, comprising:

a first roller for cleaning an edge of the semiconductor wafer, and a second roller for rotating the semiconductor wafer, the first roller being configured to rotate in a direction at a first speed and the second roller being configured to rotate in the direction at a second speed so as to facilitate an edge cleaning of the semiconductor wafer by the first roller, the edge of the semiconductor wafer is cleaned due to friction from a difference in tangential velocity at a point of contact between the semiconductor wafer and the first roller.

2. The scrubber defined in claim 1 wherein the mechanism edge cleans particles from a bevel area of the semiconductor wafer.

3. The scrubber defined in claim 1 wherein the edge of the semiconductor wafer is cleaned due to friction between the edge and an abrasive material.

4. The scrubber defined in claim 1 wherein the first roller comprises an abrasive material.

5. The scrubber defined in claim 4 wherein the second speed is faster than the first speed.

6. The scrubber defined in claim 5 wherein the second speed is approximately 1.5 times the first speed.

7. The scrubber defined in claim 4 wherein the cleaning mechanism further comprises a water jet propelling water at an area of contact between the semiconductor wafer and the first roller.

8. The scrubber defined in claim 1 wherein the second roller comprises an abrasive material.

9. The scrubber defined in claim 8 wherein the abrasive material comprises a pad.

10. The scrubber defined in claim 8 wherein the abrasive material comprises poly vinyl alcohol (PVA).

11. The scrubber defined in claim 8 wherein the abrasive material comprises nylon.

12. The scrubber defined in claim 8 wherein the abrasive material comprises polyurethane.

13. A scrubber for scrubbing a semiconductor wafer having an edge, comprising:

a first roller for clearing an edge of the semiconductor wafer; and a second roller for rotating the semiconductor wafer, the first roller being configured to rotate in a direction at a first speed and the second roller being configured to rotate in the direction at a second speed so as to facilitate an edge cleaning of the semiconductor wafer by the first roller by generating friction between the edge and an abrasive material on the first roller.

14. The scrubber defined in claim 13 wherein the mechanism edge cleans particles from a bevel area of the semiconductor wafer.

15. The scrubber defined in claim 13 wherein the abrasive material comprises poly vinyl alcohol (PVA).

16. The scrubber defined in claim 13 wherein the abrasive material comprises nylon.

17. The scrubber defined in claim 13 wherein the abrasive material comprises polyurethane.

18. A scrubbing apparatus for cleaning a semiconductor substrate with an edge, said apparatus comprising:

a first roller that rotates the semiconductor substrate at a first speed; and a second roller that rotates in a same direction as the first roller at a second speed different than the first speed and contacts the edge of the semiconductor substrate when the edge is cleaned due to a difference in tangential velocity at a point of contact between the semiconductor substrate and the second roller.

19. The apparatus defined in claim 18 wherein the semiconductor substrate further includes at least one bevel area, and the second roller cleans said at least one bevel area due to the difference in tangential velocity.

20. The apparatus defined in claim 18 wherein the second roller comprises an abrasive material.

21. The apparatus defined in claim 20 wherein the abrasive material comprises a pad.

22. The apparatus defined in claim 20 wherein the abrasive material comprises poly vinyl alcohol (PVA).

23. The apparatus defined in claim 20 wherein the abrasive material comprises nylon.

24. The apparatus defined in claim 20 wherein the abrasive material comprises polyurethane.

25. The apparatus defined in claim 18 wherein both rollers comprise an abrasive material.

26. The apparatus defined in claim 18 wherein the first roller has a rotational speed that is faster than rotational speed of the second roller.

27. The apparatus defined in claim 18 wherein the rotational speed of the first roller is approximately 1.5 times the rotational speed of the second roller.

28. The apparatus defined in claim 18 further comprising a water jet propelling water at the point of contact during side scrubbing of the semiconductor substrate.

29. The apparatus defined in claim 18 further comprising a jet propelling at least one chemical at the point of contact during side scrubbing edge cleaning of the semiconductor substrate.

30. The apparatus defined in claim 29 wherein said at least one chemical comprises $NH_4OH$.

31. The apparatus defined in claim 29 wherein said at least one chemical comprises $NH4OH/H_2O_2$.

* * * * *